US 6,552,622 B1

United States Patent
Shearon et al.

(10) Patent No.: US 6,552,622 B1
(45) Date of Patent: Apr. 22, 2003

(54) OSCILLATOR HAVING REDUCED SENSITIVITY TO SUPPLY VOLTAGE CHANGES

(76) Inventors: William Brandes Shearon, 311 Hedgewyck Dr., Findlay, OH (US) 45840; Salomon Vulih, 90 Beechwood Cir., Neshanic Station, NJ (US) 08853

( * ) Notice: Subject to any disclaimer, the term of this patent is extended or adjusted under 35 U.S.C. 154(b) by 0 days.

(21) Appl. No.: 09/639,407

(22) Filed: Aug. 14, 2000

(51) Int. Cl.[7] ................................................. H03B 5/24
(52) U.S. Cl. ........................ 331/111; 331/143; 331/46; 331/175; 327/131
(58) Field of Search .................................. 327/261, 107, 327/131; 331/46, 47, 185, 111, 143, 113 R, 175

(56) References Cited

U.S. PATENT DOCUMENTS

| | | | |
|---|---|---|---|
| 3,618,131 A | * 11/1971 | Garde | ........................ 331/113 |
| 4,977,379 A | 12/1990 | Kielmeyer | .................... 331/56 |
| 5,339,055 A | 8/1994 | Wyatt | .......................... 332/144 |
| 5,668,508 A | * 9/1997 | Pulvirenti et al. | .......... 331/111 |
| 6,188,261 B1 | * 2/2001 | Nosaka et al. | .............. 327/261 |
| 6,362,697 B1 | * 3/2002 | Pulvirenti | .................... 331/111 |

* cited by examiner

Primary Examiner—Arnold Kinkead
(74) Attorney, Agent, or Firm—Allen, Dyer, Doppelt, Milbrath & Gilchrist, P.A.

(57) ABSTRACT

An oscillator includes a first sawtooth waveform generator for generating a first sawtooth waveform having a selectively started ramp portion and a second sawtooth waveform generator for generating a second sawtooth waveform having a selectively started ramp portion. A controller is also included for alternatingly controlling the first and second sawtooth waveform generators so that a transition to the ramp portion of one sawtooth waveform is based upon determining the ramp portion of the other sawtooth waveform reaching a trip point. The controller also sets the trip point substantially independent of a supply voltage so that the oscillator has reduced sensitivity to supply voltage changes.

24 Claims, 3 Drawing Sheets

OSCILLATOR HAVING REDUCED SENSITIVITY TO SUPPLY VOLTAGE CHANGES

FIELD OF THE INVENTION

The present invention relates to the field of electronic circuits, and, more particularly, to oscillators.

BACKGROUND OF THE INVENTION

Many integrated circuit electronic devices use oscillators for providing timing or clock signals. In fact, as an integrated sub-circuit, the use of oscillators is ubiquitous. Although there are many circuit approaches to realizing an oscillator, the basic function is ultimately the same. Generally speaking, oscillators provide clock signals by alternating their outputs between two voltages (such as Vdd and ground, for example) at a particular frequency. One undesirable characteristic of most oscillators is that the frequency of their output signals is overly sensitive to variations in the operating voltages and also the variations in the manufacturing process parameters themselves. As supply voltage variations increase, for example, the resulting effect on the frequency may be unacceptable in many applications.

Another characteristic of most oscillators is that they require a precision voltage or current reference. Such references may not be available or may be expensive to build as a separate circuit. In addition, it may be difficult to implement such precision references in applications where very little supply current is available.

Some prior art oscillator circuits include multiple oscillators to provide additional control over output frequency. For example, two oscillators may be used in an oscillator circuit to double its resulting output frequency. One such oscillator is disclosed in U.S. Pat. No. 4,977,379 entitled "Differential Pair, Push-Push Oscillator" to Kielmeyer which contains two single oscillators that generate signals equal in frequency and 180° out of phase. The outputs of the oscillators are connected together to provide a resulting output that is twice the frequency of the single oscillators. A stated goal of the patent is to provide a more stable output signal by forming a composite signal rather than a summation of the two spurious signals. Yet, the output frequency of such an oscillator may still be effected by variations in the supply voltage or other process parameters.

SUMMARY OF THE INVENTION

In view of the foregoing background, it is therefore an object of the invention to provide an oscillator having reduced sensitivity to supply voltage changes.

This and other objects, features, and advantages in accordance with the present invention are provided by an oscillator including a first sawtooth waveform generator for generating a first sawtooth waveform having a selectively started ramp portion and a second sawtooth waveform generator for generating a second sawtooth waveform also having a selectively started ramp portion. The oscillator further includes a controller for alternatingly controlling the first and second sawtooth waveform generators so that a transition to the ramp portion of one sawtooth waveform is based upon determining the ramp portion of the other sawtooth waveform reaching a trip point. The controller sets the trip point substantially independent of a supply voltage so that the oscillator has reduced sensitivity to supply voltage changes.

Each of the first and second sawtooth waveform generators may include at least one switching transistor and a capacitor connected thereto, and the controller may include a biasing circuit connected to the at least one switching transistor of said first and second sawtooth waveform generators. The biasing circuit may include a bias current generator generating at least one bias current related to the supply voltage.

The biasing circuit may include at least one respective biasing transistor sized, along with the at least one switching transistors of the first and second sawtooth waveform generators, to cause the transition of the first and second waveforms at the trip point. As a result, the oscillator substantially eliminates variation in output frequency over a wide range of supply voltages. Also, the oscillator does not require an external precision reference current, thereby reducing complexity of the oscillator. The at least one biasing transistor and the switching transistor may be FETs or bipolar transistors.

The controller may set the trip point adjacent a respective end of the ramp portions, and the controller may further include a hysteresis circuit for providing hysteresis in switching. Furthermore, the controller may include a set/ reset flip-flop having a set input receiving the first sawtooth waveform and a reset input receiving the second sawtooth waveform. Additionally, the oscillator may include a shutdown circuit for disabling the first and second sawtooth waveform generators and the controller.

A method for generating an oscillating signal according to the invention includes generating a first sawtooth waveform having a ramp portion, generating a second sawtooth waveform also having a ramp portion, and transitioning to the ramp portion of one sawtooth waveform based upon determining the ramp portion of the other sawtooth waveform reaching a trip point.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
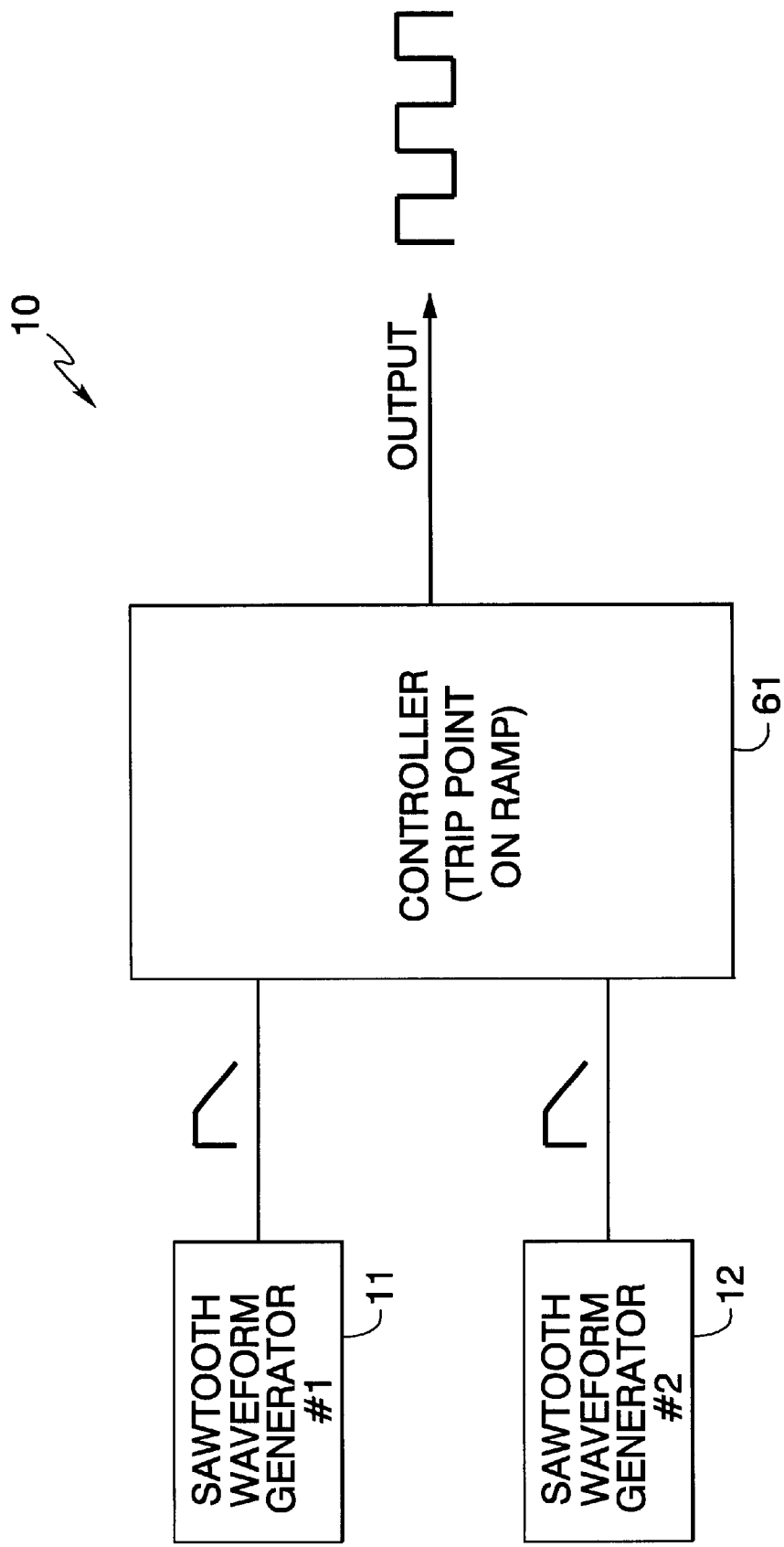
FIG. 1 is a schematic block diagram of an oscillator according to the present invention.
Figure 2:
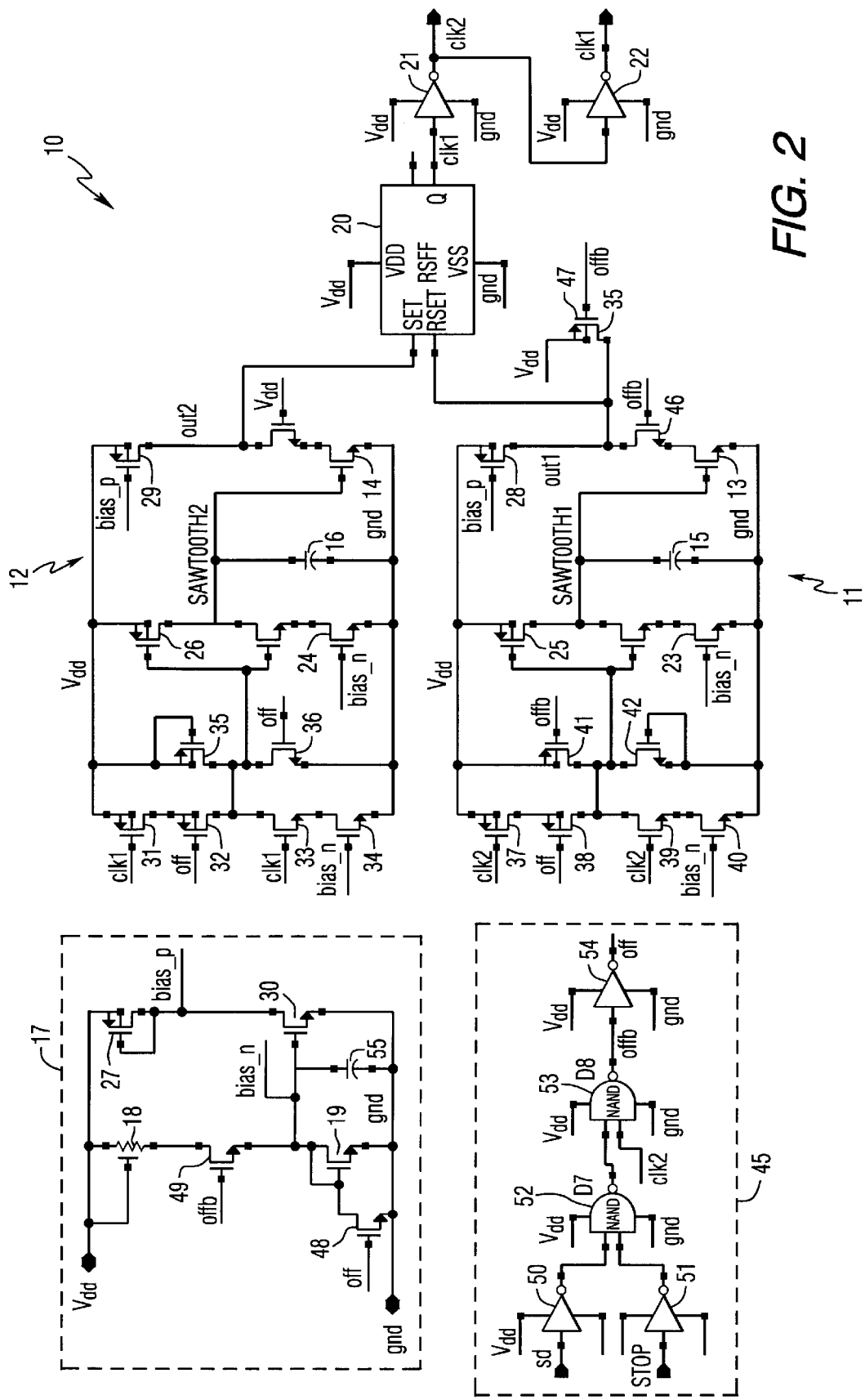
FIG. 2 is a schematic circuit diagram illustrating the oscillator of FIG. 1 in greater detail.
Figure 3:
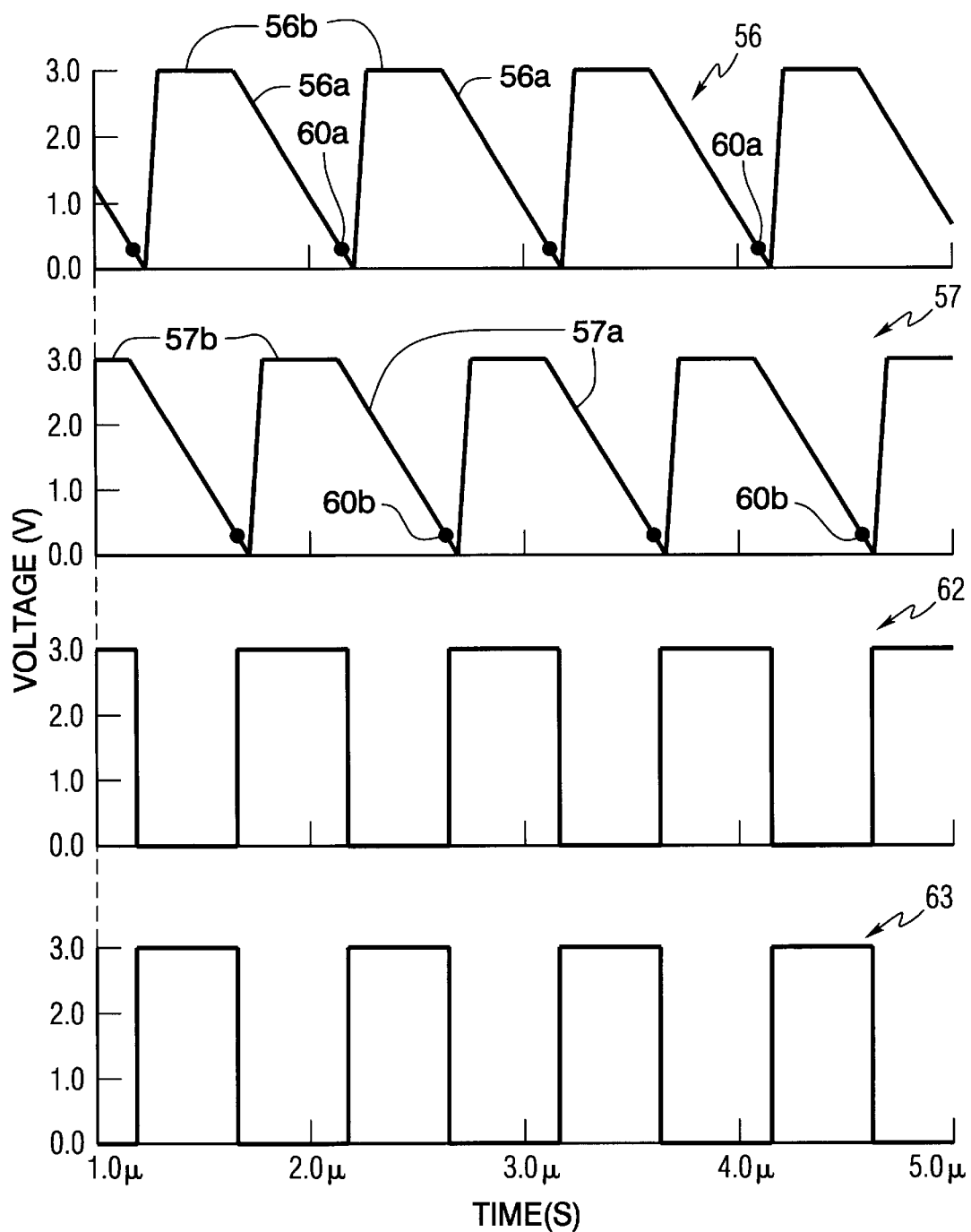
FIG. 3 is a timing diagram illustrating the waveforms and outputs of the oscillator of FIG. 1.

Turning now to FIGS. 1 through 3, an oscillator 10 according to the present invention is first described. As may be seen in FIG. 1, the oscillator 10 is a two-phase oscillator including first and second sawtooth waveform generators 11, 12. The oscillator 10 also includes a controller 61 for alternatingly controlling the first and second sawtooth waveform generators. The first and second sawtooth waveform generators 11, 12 generate respective first and second sawtooth waveforms 56, 57, each of which has a selectively started ramp portion 56a, 57a, as seen in the timing diagram of FIG. 3. The first and second sawtooth waveform generators 11, 12 each include a biasing transistor 23, 24, a switching transistor 13, 14 and a capacitor 15, 16, respectively, connected thereto, as seen in FIG. 2, for generating the ramp portions 56a, 57a, as described in greater detail below.

The controller 61 may be provided by a biasing circuit 17 and other circuitry described below. As seen in FIG. 2, the biasing circuit 17 illustratively includes a bias current generator including a resistive element 18 connected to a supply voltage Vdd, a biasing transistor 19 connected at its drain to the resistive element, a transistor 30 having its gate connected to the drain of the biasing transistor, and an optional bypass capacitor 55 connected between the drain of the biasing transistor and ground. The bias current sets up a current mirror reference voltage "bias_n" at the drain of the biasing transistor 19. The current in this mirror is defined by the following equation, as will be appreciated by those of skill in the art:

$$i[\text{bias\_n}] = \frac{Vdd - \text{bias\_n}}{R} \quad (1)$$

where the voltage bias_n, which is equal to $V_{TN}$ at the given current, is the threshold voltage of the biasing transistor 19 and R is the resistance of the resistive element 18. The resistive element 18 may be a single resistor or a network of resistors, or it may be a linear circuit device or network of such devices, as will be appreciated by those of skill in the art. It is preferable that the resistive element 18 define a linear relationship between current and voltage. The biasing transistor 19 and the transistor 30 are illustratively shown as n-channel FETs, but they may alternatively be P-channel FET's connected in converse manner to the Vdd supply, as will be appreciated by those of skill in the art.

Each of the first and second sawtooth waveform generators 11, 12 also includes a simple comparator including the transistors 13, 28 and 14, 29, respectively. This comparator has an inherent trip threshold at the voltage of bias_n because the switching transistors 13, 28 and 14, 29 are sized to match the biasing transistor 19, and the current source transistors 28, 29 run the same current as the biasing transistor 19. A flip-flop 20 stores the states of the comparator outputs. The flip-flop 20 is illustratively shown as a set/reset flip-flop, but those of skill in the art will appreciate that other types of flip-flops may also be used. Inverters 21, 22 buffer the output of flip-flop 20 and create the square-wave clock signals 62, 63 shown in FIG. 2, as will be appreciated by those of skill in the art. The clock signals 62, 63 alternatingly control the first and second sawtooth waveform generators. That is, when clock signals 62, 63 go high, the voltage Vdd is applied to the capacitors 15, 16, respectively, allowing them to relatively quickly charge to Vdd. During this time, flat portions 56b, 57b of respective sawtooth waveforms 56, 57 are also substantially equal to Vdd, as may be seen in FIG. 2. When the clock signals 62 and 63 are low, the capacitors 15, 16 are disconnected from Vdd, and the capacitors then discharge through the biasing transistors 23, 24, respectively, thereby generating the ramp portions 56a, 57a.

In the illustrated embodiment, the biasing transistor 19, and the switching transistors 13, 14 are shown to be n-channel FETs, but those of skill in the art will understand that other configurations are possible, such as making these devices p-channel transistors or bipolar transistors, for example. As a result, the trip point 60 is adjacent a respective end of the ramp portions 56a, 57a of sawtooth waveforms 56, 57. By setting the trip point 60 in this manner, the process parameter, $V_{TN}$, also called the threshold voltage, which sets the voltage bias_n may be substantially eliminated from equation (1), noted above.

A transition to the ramp portion of one sawtooth waveform is based upon determining the ramp portion of the other sawtooth waveform reaching the trip point 60. Since the current which generates bias_n varies directly with the term Vdd—bias_n and the magnitude of the ramps' voltage excursions are also equal to the term Vdd—bias_n, these two terms are canceled. In the capacitor equation which relates current to voltage applied, $$i = C * \frac{dv}{dt} \quad (2)$$

where i=current into the capacitor, C is the capacitance, dv is change in voltage, and dt is the change in time, or 1/frequency.
This can be arranged to:

$$dt = C * \frac{dv}{i} \quad (3)$$

Since dv=(Vdd−bias_n), and i=(Vdd−bias_n)/R, The equation reduces to:

$$dt = C*R \quad (4)$$

In other words, with increased Vdd, the height of the ramp increases, but slope also increases to the same degree such that the ramp's duration, dt, is unchanged. Thus, the output frequency remains substantially constant over a large range of supply voltage, as will be appreciated by those of skill in the art. Furthermore, by selectively switching between the two sawtooth waveform generators 11, 12 based upon the trip point 60, the clock signals 62, 63 are substantially unaffected by the delay or turn-around time required to refresh the switching capacitors 15, 16. Additionally, those of skill in the art will appreciate that the oscillator 10 may be used in applications where an external precision reference circuit is unavailable.

The bias circuit 17 may include a transistor 27 for providing a bias current bias_p to the gates of transistors 28, 29 of the sawtooth waveform generators 11, 12, respectively. The bias current bias_p biases the transistors 28, 29 so that the comparators including the transistors 13, 28 and 14, 29 have their trip points at the voltage bias_n. The transistors 27, 28, 29 are p-channel FETs in the illustrated embodiment, although alternate embodiments are also possible. For example, the transistors 27, 28, 29 may be n-channel FETs, or cascodes may be used to further enhance the bias currents bias_n and bias_p, as will be appreciated by those of skill in the art. Furthermore, bipolar transistors may be utilized in the biasing circuit 17 to produce the bias currents bias_n and/or bias_p, as will also be understood by those skilled in the art.

The controller may further include a hysteresis circuit including transistors 31, 33, 34, 37, 39, 40, for providing hysteresis immediately after the trip point 60a, 60b in switching between the sawtooth waveforms 56, 57, as will be appreciated by those of skill in the art. The oscillator 10 may also include a shutdown circuit 45 for disabling the sawtooth waveform generators 11, 12, the flip-flop 20, and the bias circuit 17 by applying one of shutdown signals off, offb to each of transistors 32, 36, 38, 41, 46, 47, 48, 49. The shutdown circuit 45 includes inverters 50, 51 respectively connected at their inputs to the signals sd, stop, and a NAND gate 52 connected at its input to the outputs of the inverters 50, 51. The NAND gate 52 is connected at its output to an input of a NAND gate 53 having another input connected to the clock signal 63. The shutdown signal offb is provided at an output of the NAND gate 53, which is in turn connected to the input of an inverter 54 to provide the shutdown signal off at its output.

A method for generating an oscillating signal using the oscillator 10 includes generating a first sawtooth waveform 56 having a ramp portion 56a, generating a second sawtooth waveform 57 having a ramp portion 57a, and transitioning to the ramp portion of one sawtooth waveform based upon determining the ramp portion of the other sawtooth waveform reaching a trip point 60. The method may further include setting the trip point 60 substantially independent of a supply voltage (e.g., Vdd), which may include setting the trip point 60 adjacent a respective end of the ramp portions 56a, 57a or generating at least one bias current related to the supply voltage. Furthermore, the method may include providing hysteresis in switching between the first and second sawtooth waveforms 56, 57.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. An oscillator comprising:
    a first sawtooth waveform generator for generating a first sawtooth waveform having a selectively started ramp portion;
    a second sawtooth waveform generator for generating a second sawtooth waveform having a selectively started ramp portion; and
    a controller for alternatingly controlling the first and second sawtooth waveform generators so that a transition to the ramp portion of one sawtooth waveform is based upon determining the ramp portion of the other sawtooth waveform reaching a trip point, said controller also varying a slope of the first and second sawtooth waveforms based upon a supply voltage so that a duration of the first and second sawtooth waveforms remains substantially constant over a supply voltage range.

2. The oscillator of claim 1 wherein each of said first and second sawtooth waveform generators comprises at least one switching transistor and a capacitor connected thereto.

3. The oscillator of claim 2 wherein said controller comprises a biasing circuit connected to the at least one switching transistor of said first and second sawtooth waveform generators.

4. The oscillator of claim 3 wherein said biasing circuit comprises a bias current generator generating at least one bias current related to the supply voltage.

5. The oscillator of claim 3 wherein said biasing circuit comprises at least one respective biasing transistor matched for the at least one switching transistors of said first and second sawtooth waveform generators.

6. The oscillator of claim 5 wherein said at least one biasing transistor and each of said at least one switching transistors comprises a FET.

7. The oscillator of claim 1 wherein said controller sets the trip point adjacent a respective end of the ramp portions.

8. The oscillator of claim 1 wherein said controller comprises a hysteresis circuit for providing hysteresis in switching.

9. The oscillator of claim 1 wherein said controller comprises a set/reset flip-flop having a set input receiving the first sawtooth waveform and a reset input receiving the second sawtooth waveform.

10. The oscillator of claim 1 further comprising a shutdown circuit for disabling said first and second sawtooth waveform generators and said controller.

11. An oscillator comprising:
    a first sawtooth waveform generator for generating a first sawtooth waveform having a ramp portion;
    a second sawtooth waveform generator for generating a second sawtooth waveform having a ramp portion; and
    a controller for alternatingly controlling the first and second sawtooth waveform generators so that a transition to the ramp portion of one sawtooth waveform is based upon determining the ramp portion of the other sawtooth waveform reaching a trip point, said controller also varying a slope of the first and second sawtooth waveforms based upon a supply voltage so that a duration of the first and second sawtooth waveforms remains substantially constant over a supply voltage range.

12. The oscillator of claim 11 wherein each of said first and second sawtooth waveform generators comprises at least one switching transistor and a capacitor connected thereto.

13. The oscillator of claim 12 wherein said controller comprises a biasing circuit connected to the at least one switching transistor of said first and second sawtooth waveform generators.

14. The oscillator of claim 13 wherein said biasing circuit comprises a bias current generator generating at least one bias current related to the supply voltage.

15. The oscillator of claim 13 wherein said biasing circuit comprises at least one respective biasing transistor matched for the at least one switching transistor of said first and second sawtooth waveform generator.

16. The oscillator of claim 15 wherein said at least one biasing transistor and each of said at least one switching transistors comprises a FET.

17. The oscillator of claim 11 wherein said controller sets the trip point adjacent a respective end of the ramp portions.

18. The oscillator of claim 11 wherein said controller comprises a hysteresis circuit for providing hysteresis in switching.

19. The oscillator of claim 11 wherein said controller comprises a set/reset flip-flop having a set input receiving the first sawtooth waveform and a reset input receiving the second sawtooth waveform.

20. The oscillator of claim 11 further comprising a shutdown circuit for disabling said first and second sawtooth waveform generators and said controller.

21. A method for generating an oscillating signal comprising:
    generating a first sawtooth waveform having a ramp portion;
    generating a second sawtooth waveform having a ramp portion;
    transitioning to the ramp portion of one sawtooth waveform based upon determining the ramp portion of the other sawtooth waveform reaching a trip point to thereby generate the oscillating signal; and varying a slope of the first and second sawtooth waveforms based upon a supply voltage so that a duration of the first and second sawtooth waveforms remains substantially constant over a supply voltage range.

22. The method of claim 21 wherein setting the trip point comprises generating at least one bias current related to the supply voltage.

23. The method of claim 21 wherein setting comprises setting the trip point adjacent a respective end of the ramp portions.

24. The method of claim 21 further comprising providing hysteresis in switching between the first and second sawtooth waveforms.

* * * * *